(12) United States Patent
Zhao et al.

(10) Patent No.: US 8,248,287 B2
(45) Date of Patent: Aug. 21, 2012

(54) METHOD AND APPARATUS FOR REDUCING INPUT DIFFERENTIAL PAIRS FOR DIGITAL-TO-ANALOG CONVERTER VOLTAGE INTERPOLATION AMPLIFIER

(75) Inventors: Jianhua Zhao, Shanghai (CN); Reed Yang, Shanghai (CN)

(73) Assignee: STMicroelectronics R&D (Shanghai) Co., Ltd., Shanghai (CN)

( * ) Notice: Subject to any disclaimer, the term of this patent is extended or adjusted under 35 U.S.C. 154(b) by 52 days.

(21) Appl. No.: 12/965,663

(22) Filed: Dec. 10, 2010

(65) Prior Publication Data
US 2012/0062303 A1 Mar. 15, 2012

(30) Foreign Application Priority Data
Sep. 14, 2010 (CN) .......................... 2010 1 0282647

(51) Int. Cl.
*H03M 1/66* (2006.01)
(52) U.S. Cl. ........................ 341/144; 327/552
(58) Field of Classification Search .................. 341/144, 341/145; 327/552, 306, 382, 560, 161; 345/145
See application file for complete search history.

(56) References Cited

U.S. PATENT DOCUMENTS

| | | | |
|---|---|---|---|
| 5,731,774 A | 3/1998 | Fujii et al. | |
| 5,977,898 A | 11/1999 | Ling et al. | |
| 6,163,289 A | 12/2000 | Ginetti | |
| 6,642,877 B2 | 11/2003 | Leung | |
| 7,079,062 B2 | 7/2006 | Panov et al. | |
| 7,173,597 B2 | 2/2007 | Kato | |
| 7,283,082 B1 | 10/2007 | Kuyel | |
| 7,304,596 B2 | 12/2007 | Lin et al. | |
| 2003/0128071 A1* | 7/2003 | Nguyen et al. | 330/254 |
| 2012/0032828 A1 | 2/2012 | Zhao et al. | |

* cited by examiner

*Primary Examiner* — Joseph Lauture
(74) *Attorney, Agent, or Firm* — Gardere Wynne Sewell LLP

(57) ABSTRACT

For voltage interpolation amplifiers used in digital-to-analog converter architecture, the number of input differential pairs required by the voltage interpolation amplifier may be reduced such that an N-bit voltage interpolation amplifier comprises N+1 input differential pairs connected through a resistor attenuation network to provide a binary-weighted effective transconductance. In comparison to conventional voltage interpolation amplifier designs, the number of input differential pairs and power consumed by the circuit is significantly reduced, thereby creating a more area- and power-efficient voltage interpolation amplifier.

52 Claims, 6 Drawing Sheets

US 8,248,287 B2

METHOD AND APPARATUS FOR REDUCING INPUT DIFFERENTIAL PAIRS FOR DIGITAL-TO-ANALOG CONVERTER VOLTAGE INTERPOLATION AMPLIFIER

CROSS-REFERENCE TO RELATED APPLICATIONS

Pursuant to 35 U.S.C. §119 (a)-(d), this application claims priority to Chinese Patent Application No. 201010282647.X, entitled "Method and Apparatus for Reducing Input Differential Pairs for Digital-to-Analog Converter Voltage Interpolation Amplifier," filed Sep. 14, 2010.

BACKGROUND

1. Technical Field

The present invention relates generally to Digital-to-Analog circuitry and, more specifically, to a method and apparatus for reducing the number of input differential pairs for a Digital-to-Analog Converter voltage interpolation amplifier.

2. Introduction

Digital-to-Analog Converter (DAC) architecture is commonly used in mixed-mode systems requiring monotonicity, wherein the DAC acts as an interface to convert a digital code to an analog signal. Conventional DAC designs typically include a differential resistor string embodiment producing output voltages. These designs attempt to extend the resolution of differential resistor string DACs by feeding the output voltages into a voltage interpolation amplifier.

One such resistor string DAC design includes an M-bit DAC combined with an N-bit voltage interpolation amplifier to achieve M+N bit total resolution, wherein the DAC is used to generate two DAC voltages with a voltage difference of $2N*VLSB$, the voltage difference across a given resistor in a string of resistors in the coarse DAC circuit. The two DAC voltages are fed into the voltage interpolation amplifier and interpolated to generate the final DAC voltage output. Conventional voltage interpolation amplifier designs use $2N$ unary-weighted identical input differential pairs with their drains summed together and respective gates controlled by a digital code. Accordingly, as the interpolation bit, N, increases, the number of differential pairs increases exponentially for these conventional amplifiers. Each differential pair requires an independent current source; therefore, the increase in differential pairs not only requires more circuit real estate, but also results in a substantial increase in power consumption. Therefore, there is a need for an improved voltage interpolation amplifier design that reduces the circuit complexity and power consumption of current voltage interpolation designs, thereby creating a more area- and power-efficient voltage interpolation amplifier.

SUMMARY

An embodiment of the present disclosure provides a voltage interpolation amplifier comprising N+1 input differential pairs connected through a resistor attenuation network to provide a binary-weighted effective transconductance. In comparison to conventional voltage interpolation amplifier designs, the number of input differential pairs and power consumed by the circuit is significantly reduced.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures, in which like reference numbers indicate similar parts, and in which.

DETAILED DESCRIPTION OF THE DRAWINGS

Figure 1:
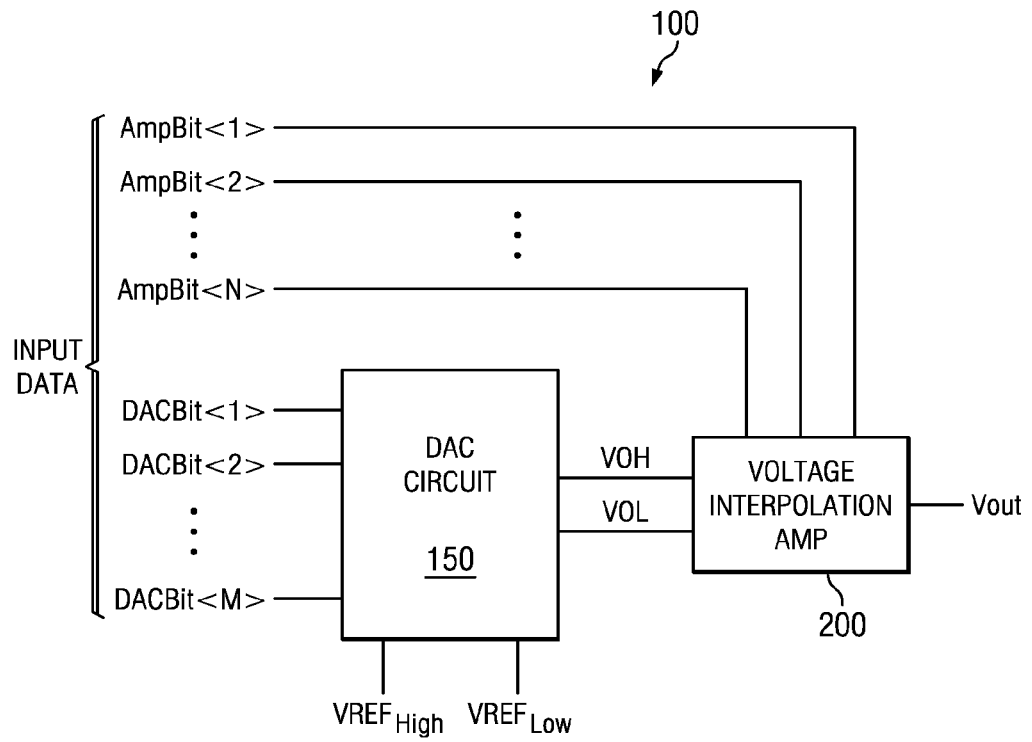
FIG. 1 is a circuit diagram of an example DAC architecture.

In the description that follows, like features or elements are marked throughout the specification and drawings with the same reference numerals, respectively.

The present disclosure provides a voltage interpolation amplifier comprising N+1 input differential pairs each connected through a resistor attenuation network to provide a binary-weighted effective transconductance. In comparison to conventional voltage interpolation amplifier designs, the number of input differential pairs and power consumed by the circuit is significantly reduced since the number of differential pairs only increases linearly for any increase in the number of input bits.

Reference is made to FIG. 1, which illustrates a general DAC architecture 100 including an example DAC circuit 150 and a voltage interpolation amplifier 200 (otherwise referred to as "interpolation amplifier," "amplifier," and "amp") as described in accordance with the present disclosure. Input data is provided to the DAC architecture 100 as input data bits AmpBit<1:N> and DACBit<1:M>. The DAC circuit 150 of FIG. 1 is an M-bit DAC receiving input data bits DACBit<1:M>, and outputting a high output voltage, VOH, and a low output voltage, VOL. The DAC circuit 150 is not limited to a specific DAC circuit and may include any differential resistor string DAC or other DAC circuitry. The interpolation amplifier 200 is an N-bit voltage interpolation amplifier receiving input data bits AmpBit<1:N>. The M-bit DAC circuit 150 and N-bit interpolation amplifier 200 comprise a DAC architecture 100 with M+N bit total resolution.

The DAC circuit 150 of FIG. 1 includes a high reference voltage node $VREF_{HIGH}$ and a low reference voltage node $VREF_{LOW}$. The DAC circuit 150 receives a high reference voltage at the $VREF_{HIGH}$ node and a low reference voltage at the $VREF_{LOW}$ node. The DAC circuit 150 produces high and low output voltages, VOH and VOL, in response to the DACBit<1:M> signals. The difference between the two output voltages, VOH and VOL, is, for an example resistor string DAC, the voltage difference across one resistor in a string of resistors in the coarse DAC circuit 150. For example, if the DAC circuit 150 is a 7-bit DAC with 128 resistors, and a reference voltage of 1.024V is divided evenly across the string of resistors, then the difference across a resistor located between the two voltages, and thus, the difference between VOH and VOL, is approximately 8 mV (1.024V divided across 128 resistors). The value of the voltage difference across one resistor in a string of resistors may also be represented as $2^{N}*V_{LSB}$, wherein $V_{LSB}$=1 mV. Accordingly, as shown in FIGS. 1, N=3, and $2^{3}*1$ mV=8 mV.

Figure 2:
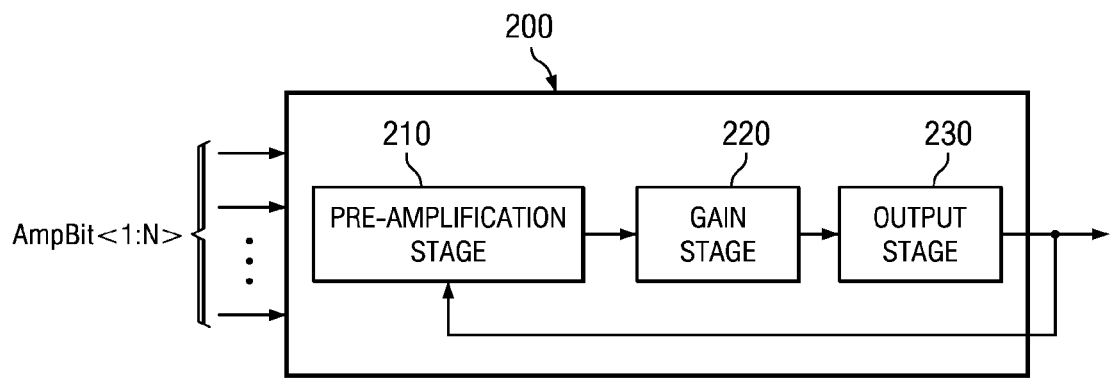
FIG. 2 is a general overview of the stages comprising a voltage interpolation amplifier as presented in the DAC architecture of FIG. 1.

The high and low output voltages VOH and VOL are provided as input to the N-bit voltage interpolation amplifier 200 along with input data bits AmpBit<1:N>. As illustrated in FIG. 2, the voltage interpolation amplifier 200 includes three stages: a pre-amplification stage 210, a gain stage 220, and an output stage 230. In general, the voltage interpolation amplifier 200 receives N input data bits (AmpBit<1:N>), voltages VOH and VOL, and feedback from the final output voltage $V_{OUT}$ at the pre-amplification stage 210. Each input differential pair is comprised of a first and second transistor. The input data bits AmpBit<1:N> selectively apply the voltages VOH and VOL to the first transistors in the input differential pairs, while the feedback from the output voltage $V_{OUT}$ is applied to the second transistors. The voltages of the input differential pairs are then attenuated to produce effective transconductances, wherein the effective transconductances are binary-weighted. The currents from the first and second transistors in the input differential pairs are then sent to the gain stage 230. To drive the circuit load, the currents received at the input of the gain stage 230 from the second transistors must equal the currents received from the first transistors. To ensure equal currents, the gain stage 220 adjusts the final output voltage $V_{OUT}$ to control the feedback connected to the pre-amplification stage 210. This forces the current from the second transistors in the input differential pairs to match the current from the first transistors in the input differential pairs. The adjusted final output voltage $V_{OUT}$ is provided at the output stage 230 of the DAC architecture 100 as the interpolated voltage value.

Several components of the present disclosure may comprise multiple elements, and may be represented as a group of said elements in a particular order. For example, the input data of the voltage interpolation amplifier 200 of FIG. 1 is comprised of N bits. Accordingly, the bits may be represented as "AmpBit<1:N>" wherein "1" and "N" indicate AmpBit 1, or AmpBit<1>, through AmpBit N, or AmpBit<N>, (and all bits in between) in ascending order. Additionally, if the bits are represented as "AmpBit<N:1>" the numbers indicate AmpBit<N> through AmpBit<1> (and all bits in between) in descending order. This representation may be applied to any group of elements within the present disclosure. Additionally, when the disclosure refers to a "Kth" input differential pair, K is defined as the specific number of the input differential pair for input differential pairs PAIR<1:N>, and not the N+1th pair. For example, for the first input differential pair (PAIR<1>) K=1, for the second input differential pair (PAIR<2>) K=2 . . . and for the Nth input differential pair (PAIR<N>) K=N.

The essence of the invention relates primarily to the pre-amplification stage 210 of the voltage interpolation amplifier 200; therefore, it should be appreciated by those of ordinary skill in the art that the improved pre-amplification stage disclosed herein may be applied to a variety of interpolation amplification circuits having various gain-boosting and output stages without departing from the scope of the invention as set forth and defined in the present disclosure.

Figure 3:
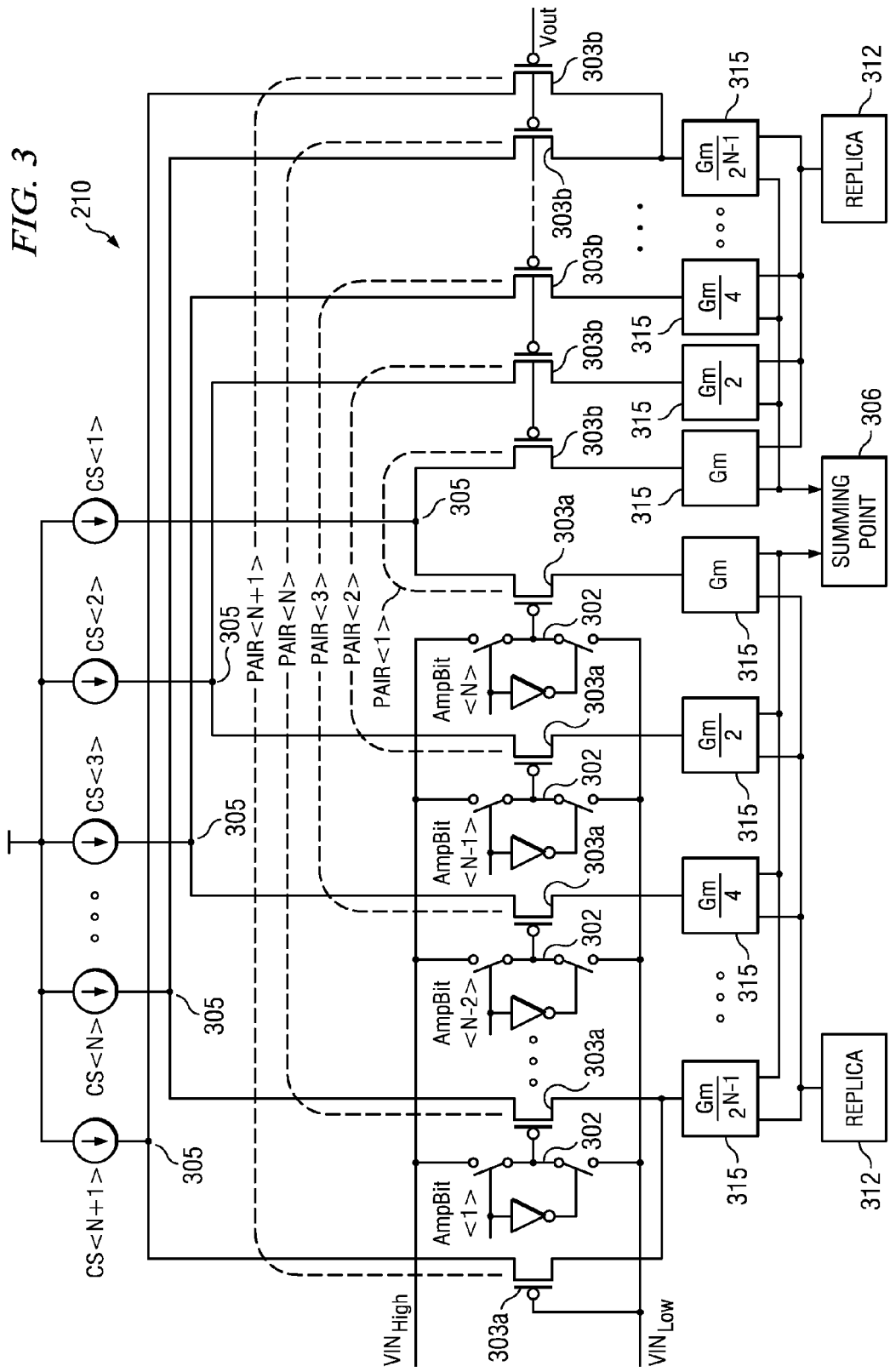
FIG. 3 is a circuit diagram of an example embodiment of the pre-amplification stage of the voltage interpolation amplifier presented in the DAC architecture of FIG. 1.

Reference is now made to FIG. 3, which illustrates an example embodiment of the low offset pre-amplification stage 210 of the example N-bit voltage interpolation amplifier 200 presented in FIG. 1. In accordance with the present disclosure, the pre-amplification stage 210 includes N+1 current sources, CS<1:N+1>, and N+1 input differential pairs PAIR<1:N+1>, wherein current sources CS<1:N+1> provide current to input differential pairs PAIR<1:N+1>, respectively, as illustrated in FIG. 3. Each input differential pair PAIR<1:N+1> comprises a first transistor 303a and a second transistor 303b, wherein each transistor 303 has an initial transconductance of Gm, and the sources of the first transistor 303a and second transistor 303b of each pair are connected together at a source node 305. Also connected to the source node 305 of each pair is the respective current source CS<1:N+1> of the input differential pair PAIR<1:N+1>.

When reference is made specifically to the first or second transistors in an input differential pair, reference numbers "303a" and "303b" will be used accordingly. However, when reference is made in general to a transistor, and it is irrelevant whether the transistor is a first or second transistor, reference number "303" will be used. Therefore, when reference number "303" is used herein, it should be understood that the reference to the transistor is appropriate for either a first transistor or a second transistor, or both.

The pre-amplification stage 210 of the voltage interpolation amplifier 200 acts as a plurality of parallel-connected differential amplifiers that utilize a negative feedback input. The negative feedback input of the pre-amplification stage 210 is connected to receive the output voltage $V_{OUT}$ at the gates of the second transistors 303b of the input differential pairs. Accordingly, the voltage $V_G$ on the gate of each second transistor 303b is equal to the output voltage $V_{OUT}$ (i.e., $V_G=V_{OUT}$ for each second transistor 303b). The positive input of the pre-amplification stage 210 is connected to receive a voltage at a high input voltage node $VIN_{HIGH}$ and at a low input voltage node $VIN_{LOW}$. In one embodiment, the voltage received at the high input voltage node $VIN_{HIGH}$ is the high output voltage VOH from the DAC circuit 150, while the voltage received at the low input voltage node $VIN_{LOW}$ is the low output voltage VOL from the DAC circuit 150. The gates of the first transistors 303a of input differential pairs PAIR<1:N> are connected via switches 302 to either input voltage node $VIN_{HIGH}$ or $VIN_{LOW}$, while the first transistor 303a in the N+1th input differential pair, PAIR<N+1>, is connected directly to the low input voltage node $VIN_{LOW}$. Accordingly, for input differential pairs PAIR<1:N>, the voltage $V_G$ on the gate of each first transistor 303a is equal to either VOH or VOL; while the voltage $V_G$ on the gate of the first transistor 303a of the N+1th input differential pair is equal to VOL.

The aforementioned switches 302 are controlled by the input data bits AmpBit<1:N> such that when an input data bit AmpBit<1:N> is a "1," the corresponding switch 302 connects its respective first transistor gate to the high input voltage node $VIN_{HIGH}$, and the voltage $V_G$ on the gate of the transistor 303a is VOH. When an input data bit AmpBit<1:N> is a "0," the corresponding switch 302 connects its respective first transistor gate to the low input voltage node $VIN_{LOW}$, and the voltage $V_G$ on the gate of the transistor 303a is VOL. As illustrated in FIG. 3, input data bits AmpBit<1:N> are connected to the input differential pairs PAIR<1:N> in reverse order such that input data bits AmpBit<1:N> control the switches 302 connected to input differential pairs PAIR<N:1>, respectively. Therefore, the first input differential pair, PAIR<1>, is controlled by AmpBit<N>, and the Nth input differential pair, PAIR<N>, is controlled by AmpBit<1>. Accordingly, the input data bits AmpBit<1:N> are selected to apply a specific voltage, VOH or VOL, to the first transistors 303a of input differential pairs PAIR<1:N>.

As illustrated in FIG. 3, the drains of the first and second transistors, 303a and 303b, each connect to a resistor attenuation network 315. Each resistor attenuation network 315 produces a binary-weighted effective transconductance for each transistor 303 of input differential pairs PAIR<1:N>, and passes the current of the connected transistor 303 to a summing point 306.

For input differential pairs PAIR<1:N>, the effective transconductance for a Kth input differential pair is defined as $Gm/(2^{K-1})$, wherein the effective transconductance of each input differential pair is reduced as K increases. The effective transconductance of the N+1th input differential pair, PAIR<N+1>, is equal to the effective transconductance of the Nth input differential pair, which is $Gm/(2^{N-1})$. This may be accomplished in several ways. For example, as shown in FIG. 3, the drains of the transistors 303 in the N+1 th input differential pair, PAIR<N+1>, are tied to the drains of the transistors 303 in the Nth input differential pair, PAIR<N>. However, it should be appreciated that in other embodiments, the drains of the transistors 303 in the N+1 th input differential pair may be separate from the drains of the transistors 303 in the Nth input differential pair and connected to separate resistor attenuation networks 315 that are identical to the resistor attenuation networks 315 connected to the drains of the transistors 303 in the Nth input differential pair.

Figure 4:
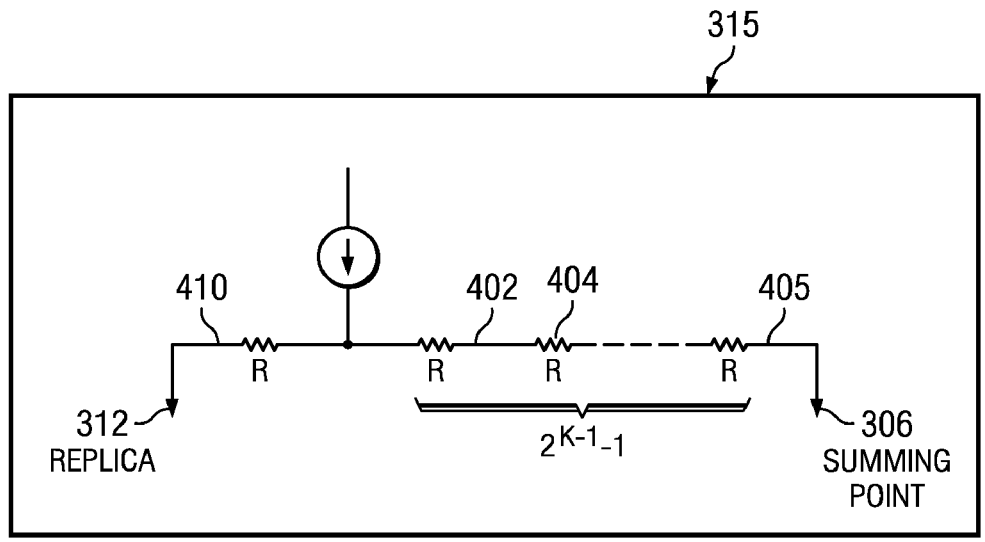
FIG. 4 is an illustration showing detail of the resistor strings presented in the voltage interpolation amplifier of FIG. 3.

FIG. 4 provides a more detailed illustration of one of the resistor attenuation networks 315 shown in FIG. 3. Each resistor attenuation network 315 comprises a string 402 of resistors 404 connected in series, wherein each resistor 404 has a resistance of R, and each resistor string 402 is connected to the drain of its respective transistor 303, the summing point 306, and a replica circuit 312 (the summing point 306 and replica circuit 312 are shown in FIGS. 3 and 5-8, and are described in greater detail below). The number of resistors 404 in each string 402, and thus, the attenuation of the initial transconductance, is dependent upon the specific input differential pair to which the resistor attenuation network 315 is connected. For input differential pairs PAIR<1:N>, the resistor string 402 is comprised of $2^{K-1}$ resistors 404, and attenuates the initial transconductance of the input differential pair to provide an effective transconductance of $Gm/(2^{K-1})$. Again, the Nth and N+1 th input differential pairs share the same resistor attenuation network 315 since the drain of the N+1 th input differential pair is tied to the drain of the Nth input differential pair. However, if in another embodiment, the N+1 th input differential pair has a separate resistor attenuation network 315, it has the same number of resistors 404 as the resistor attenuation network 315 connected to the Nth input differential pair, and therefore also provides the same effective transconductance, $Gm/(2^{N-1})$.

As previously mentioned, the resistor string 402 of each resistor attenuation network 315 connects the drain of its respective transistor 303 to both the summing point 306 and replica circuit 312. Accordingly, the current flowing from the transistor 303 is directed along a first path 405 and a second path 410. The first path 405 connects to the summing point 306 and has a resistance of $(2^{K-1}-1)R$; and the second path 410 connects to the replica circuit 312 and has a resistance of R. For a Kth input differential pair, the current received at the summing point 306 from the first path 405 may be represented as: $I_K=V_{G(K)}*Gm/(2^{K-1})$, wherein $V_{G(K)}$ is the voltage on the gate of the transistor 303 to which the resistor attenuation network 315 is connected. For example, if the resistor attenuation network 315 is connected to the first transistor 303a of the second input differential pair PAIR<2>, then $V_{G(2)}$=VOH if the input data bit AmpBit<N−1> is equal to "1," and $V_{G(2)}$=VOL if AmpBit<N−1>=0. If the resistor attenuation network 315 is connected to the second transistor 303b of an input differential pair, the voltage $V_{G(K)}$ is equal to the output voltage $V_{OUT}$, since $V_{OUT}$ is the feedback voltage connected to the gates of the second transistors 303b in the input differential pairs. Accordingly, the current received at the summing point 306 of a transistor 303 in the second input differential pair PAIR<2> may be represented as $I_2=V_{G(2)}*Gm/2$, wherein $V_{G(2)}$ is either VOH or VOL (depending on the input data bit AmpBit<N−1>) if the current is being received from the first transistor 303a, or $V_{OUT}$ if the current is being received from the second transistor 303b.

The current flowing from each resistor attenuation network 315 connected to a first transistor 303a is affected by a change in the voltage $V_G$ on the gate of its respective first transistor 303a, which is affected by a change in the input data bits AmpBit<1:N>. Therefore, the current flowing from the resistor attenuation networks 315 connected to the first transistors 303a is determined according to status of the input data bits AmpBit<1:N> in combination with the voltages received at the $VIN_{HIGH}$ and $VIN_{LOW}$ nodes. Conversely, the current flowing from the resistor attenuation networks 315 connected to the second transistors 303b is affected by a change in the voltage $V_G$ on the gates of the second transistors 303b, which is affected by a change in the output voltage $V_{OUT}$. Therefore, the voltage $V_G$ of the first transistors 303a (for input differential pairs PAIR<1:N>) may be switched between the voltages located at $VIN_{HIGH}$ and $VIN_{LOW}$ by adjusting the input data bits AmpBit<1:N>, while the voltage $V_G$ of the second transistors 303b of all input differential pairs may be changed by adjusting $V_{OUT}$. By adjusting voltages $V_G$, the current flowing from each resistor attenuation network 315 is changed since the current is dependent upon the voltage $V_G$, as shown in the equation provided above and presented again as follows: $I_K=V_{G(K)}*Gm/(2^{K-1})$.

Referring back to FIG. 3, the current $I_K$ provided by each resistor attenuation network 315 is received at the summing point 306. The total current received by the summing point 306 from the resistor attenuation networks 315 connected to the first transistors 303a is referred to hereinafter as the "first current," and is represented by the following equation:

$$I_F=\Sigma V_{G(K)}*Gm/(2^{K-1})+V_{G(N+1)}*Gm/(2^{N-1}) \text{ from } K=1 \text{ to } K=N,$$

where $V_{G(K)}$ is equal to the voltage on the gate of the first transistor 303a of the Kth input differential pair. Additionally, the total current received by the summing point 306 from the resistor attenuation networks 315 connected to the second transistors 303b is referred to hereinafter as the "second current," and is represented by the following equation:

$$I_S=\Sigma V_{G(K)}*Gm/(2^{K-1})+V_{G(N+1)}*Gm/(2^{N-1})= \\ \Sigma V_{OUT}*Gm/(2^{K-1})+V_{OUT}*Gm/(2^{N-1}) \text{ from } K=1 \text{ to } K=N.$$

As discussed above, the initial transconductance of each transistor 303 in each input differential pair is equal to Gm. Therefore the total effective transconductance of either all first transistors 303a, or all second transistors 303b, received at the summing point 306 is $Gm+Gm/2+Gm/4+\ldots+Gm/(2^{N-1})+Gm/(2^{N-1})=2$ Gm. For example, if N=6, the total effective transconductance of all the input differential pairs, PAIR<1:7>, is: $(1Gm)+(\frac{1}{2}Gm)+(\frac{1}{4}Gm)+(\frac{1}{8}Gm)+(\frac{1}{16}Gm)+(\frac{1}{32}Gm)+(\frac{1}{32}Gm)=2Gm$. As illustrated in this example, the first input differential pair, PAIR<1>, has the most significant effective transconductance, 1 Gm, and the Nth and N+1 th pairs, PAIR<6:7>, each have the least significant effective transconductance, 1/32 Gm. Accordingly, the above equations defining the first current $I_F$ and the second current $I_S$ may be redefined as follows:

$$I_F = \Sigma V_{G(K)} * Gm/(2^{K-1}) + V_{G(N+1)} * Gm/(2^{N-1}) \text{ from } K=1 \text{ to } K=N$$

$$I_S = V_{OUT} * 2Gm$$

Figure 5A:
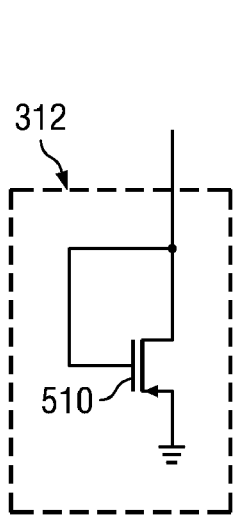
FIGS. 5A and 5B illustrate a common-mode biasing scheme for an example replica circuit and summing point.
Figure 5B:
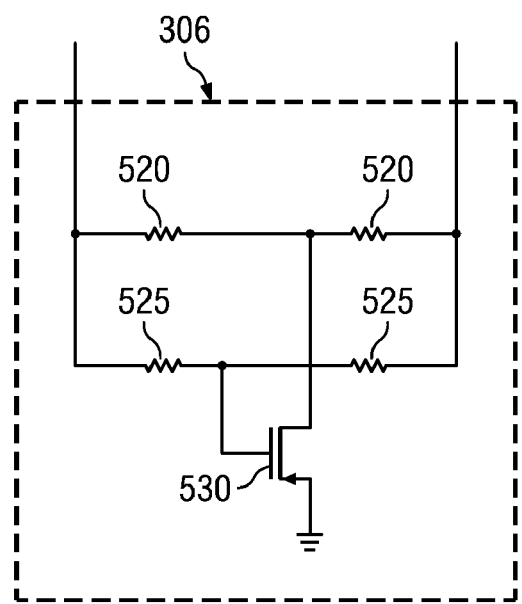

The summing point 306 feeds into the gain-boosting stage 220, therefore in order to achieve accurate transconductance ratios, the summing point 306 and replica circuit 312 must be properly biased with respect to each other. This is achieved using the common-mode biasing scheme shown in FIGS. 5A and 5B, which provide an illustration of an example replica circuit 312 and summing point 306, respectively. As illustrated in FIG. 5A, the replica circuit 312 includes a diode connected NMOS transistor 510 designed to set the DC level for the signal located at the replica circuit 312 to $1V_{GS}$, which is the voltage across the gate and source of the diode connected NMOS transistor 510. Additionally, FIG. 5B illustrates a summing point 306 having a first pair of resistors 520 operable to set the differential gain of the pre-amplification stage 210, and a second pair of resistors 525 operable to establish the proper common-mode voltage of the summing node 306.

Figure 6:
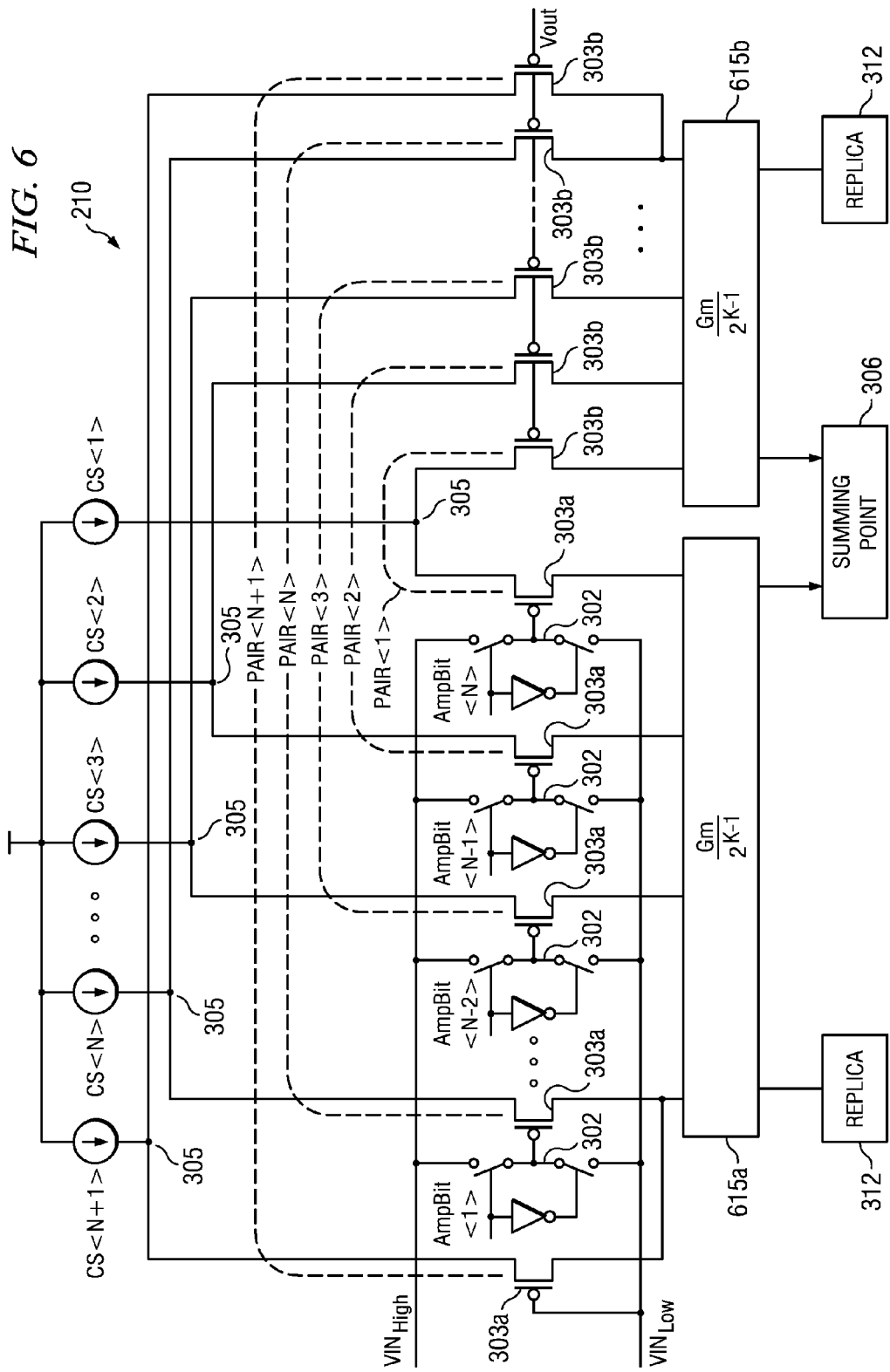
FIG. 6 is a circuit diagram of another example embodiment of the low offset pre-amplification stage of the voltage interpolation amplifier presented in the DAC architecture of FIG. 1.

FIG. 6 illustrates another example embodiment of the low offset pre-amplification stage 210 of the example N-bit voltage interpolation amplifier 200 presented in FIG. 1. The embodiment illustrated in FIG. 6 is similar to that shown in FIG. 3 except that the multiple resistor attenuation networks 315 connected to the first transistors 303a are replaced by a first single resistor attenuation network 615a, and the multiple resistor attenuation networks 315 connected to the second transistors 303b are replaced by a second single resistor attenuation network 615b. As illustrated in FIG. 6, the drains of the first and second transistors, 303a and 303b, each connect to the summing point 306 and replica circuit 312 through the first and second resistor attenuation networks 615a and 615b, respectively.

The resistor attenuation networks 615a and 615b of FIG. 6 are each comprised of a single string of $2^{N-1}$ series-connected resistors, wherein each resistor has a resistance of R. The resistor attenuation networks 615a and 615b are similar to the resistor attenuation networks 315 of the embodiment illustrated in FIG. 3 in that they are operable to attenuate the initial transconductance of the transistors 303 of the input differential pairs to which they are connected to provide a binary-weighted effective transconductance, and pass the current of the connected transistors 303 to the summing point 306.

In the present embodiment, the attenuation of each transistor 303 in the input differential pairs is dependent upon the location along the string of resistors at which the drain of the respective transistor 303 is connected. However, the drains are typically connected to the resistor string such that the effective transconductance of each transistor 303 is $Gm/(2^{K-1})$, wherein the effective transconductance of each transistor 303 of each input differential pair is reduced as K increases. As with the embodiment illustrated in FIG. 3, the drains of the transistors 303 of the N+1 th input differential pair are tied to the drains of the transistors 303 of the Nth input differential pair. Accordingly, the effective transconductance of the transistors 303 of the N+1 th input differential pair is equal to the effective transconductance of the transistors 303 of the Nth input differential pair, which is $Gm/(2^{N-1})$.

Figure 7:
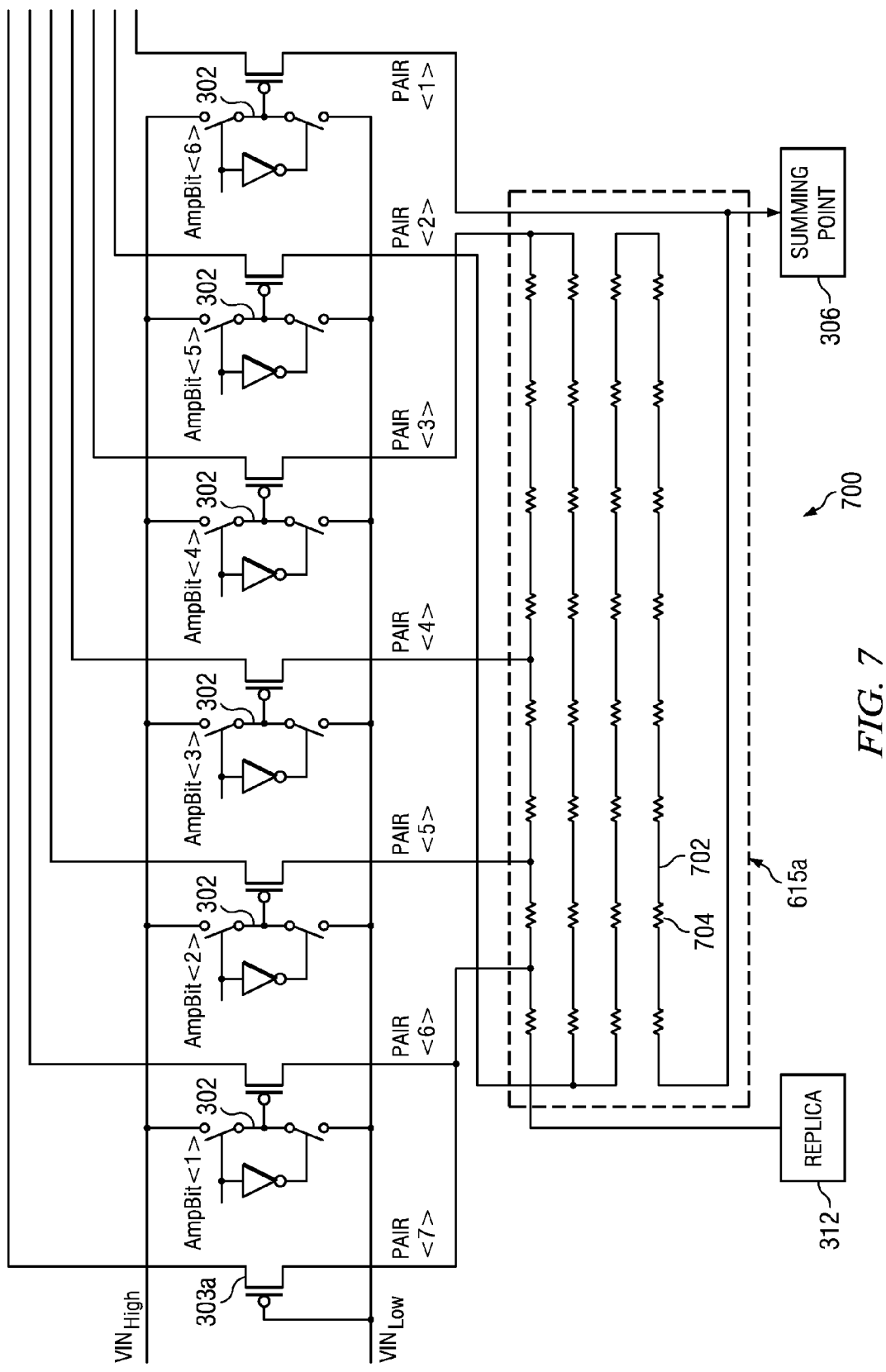
FIG. 7 is a circuit diagram illustrating the connection of input differential pairs to the resistor attenuation network of FIG. 6.

FIG. 7 is provided to illustrate in greater detail the first resistor attenuation network 615a discussed above in accordance with FIG. 6. The first resistor attenuation network 615a illustrated in FIG. 7 is shown within a low offset pre-amplification stage 700 of a 6-bit voltage interpolation amplifier. Accordingly, the pre-amplification stage 700 of FIG. 7 illustrates six input data bits, AmpBit<1:6>, seven input differential pairs, PAIR<1:7>, and a first resistor attenuation network 615a connected to the drains of the first transistors 303a of the input differential pairs. Although it is not illustrated, it should be understood that a second resistor attenuation network 615b interfaces with the summing point 306, replica circuit 312, and second transistors 303b of the input differential pairs in the same manner that the first resistor attenuation network 615a interfaces with the summing point 306, replica circuit 312, and the first transistors 303a of the input differential pairs.

The resistor attenuation network 615a illustrated in FIG. 7 comprises a string 702 of $32(2^{N-1})$ series-connected resistors 704, wherein the string 702 is connected to the replica circuit 312 and the summing point 306, and each resistor has a resistance of R. For each input differential pair, the drain of the first transistor 303a connects to the resistor string 702 of the resistor attenuation network 615a such that the current from the first transistor 303a of the input differential pair flows through the resistor attenuation network 615a along two paths. The first path 711 connects to the summing point 306, and the second path 712 connects to the replica circuit 312. The specific location at which each transistor 303a connects is determined such that the ratio of resistance between the first and second paths 711 and 712 is $(2^{K-1}-1)R:R$, wherein the first path 711 provides a resistance of $(2^{K-1}-1)R$, and an effective transconductance of $Gm/(2^{K-1})$, and the second path has a resistance of R. The drain of the first transistor 303a of the seventh input differential pair (PAIR<7>) is connected to the drain of the first transistor 303a of the sixth input differential pair (PAIR<6>), and is therefore connected to the resistor attenuation network 615a at the same location as the first transistor 303a of the sixth input differential pair PAIR<6>.

As with the embodiment illustrated in FIG. 3, for a Kth input differential pair, the current received at the summing point 306 from the first path 711 of a specific transistor 303 may be represented as: $I_K = V_G * Gm/(2^{K-1})$, wherein $V_G$ is the voltage on the gate of the specific transistor 303 from which first path 711 originates. For example, in accordance with FIG. 7, if the input data bit, AmpBit<5>, of the second input differential pair, PAIR<2>, is equal to "1", then $V_G$=VOH (the voltage located at $VIN_{HIGH}$) for the first transistor 303a of PAIR<2>. Similarly, if AmpBit<5>=0, then $V_G$=VOL (the voltage located at $VIN_{LOW}$) for the first transistor 303a of PAIR<2>. Although it is not illustrated, it should be understood that for the second transistors 303b in all input differential pairs, the voltage $V_G$ is equal to the output voltage $V_{OUT}$, since $V_{OUT}$ is the feedback voltage connected to the gates of the second transistors 303b in the input differential pairs. Accordingly, the current of a transistor 303 in the second input differential pair PAIR<2> may be represented as $I_2 = V_G * Gm/2$, wherein $V_G$ is either VOH or VOL (depending on the input data bit AmpBit<5>) if the current is being received from the first transistor 303a, or $V_{OUT}$ if the current is being received from the second transistor 303b.

As accorded by the example embodiment illustrated in FIG. 7, the resistors 704 in the string 702 are partitioned as 16:16, 24:8, 28:4, 30:2, and 31:1 for respective input pairs PAIR<2:7>. This partitioning shows the ratio of the resistance of the two paths created at the point where the drains are connected to the resistor string 702. This ratio may be represented, in simplified form, as 1:1, 3:1, 7:1, 15:1, and 31:1.

Accordingly, the ratio of resistance between the first and second paths is $(2^{K-1}-1)R:R$. It should be noted that PAIR<1> is not considered in the list of ratios since it connects such that the resistance of the first path 711 is zero and the initial transconductance is not attenuated, and thus, is equal to its effective transconductance (since $Gm/2^{K-1}=Gm$ for K=1).

Other embodiments of the present disclosure may include connecting the drains of the transistors 303 in the first input differential pair PAIR<1> directly to the summing point since the effective transconductance of the first input differential pair is equal to its initial transconductance. Additionally, the resistor attenuation networks 315 and 615 illustrated in FIGS. 3 and 6, respectively, are provided as examples of methods of attenuating the initial transconductances of the input differential pairs. Accordingly, the present disclosure is not limited to the resistor attenuation networks 315 and 615 disclosed herein, and may include other methods of attenuating the initial transconductances of the input differential pairs. In addition, although the replica circuits 312 in FIGS. 3 and 6 are illustrated separately, they may be a single circuit shared by all resistor attenuation networks.

Figure 8:
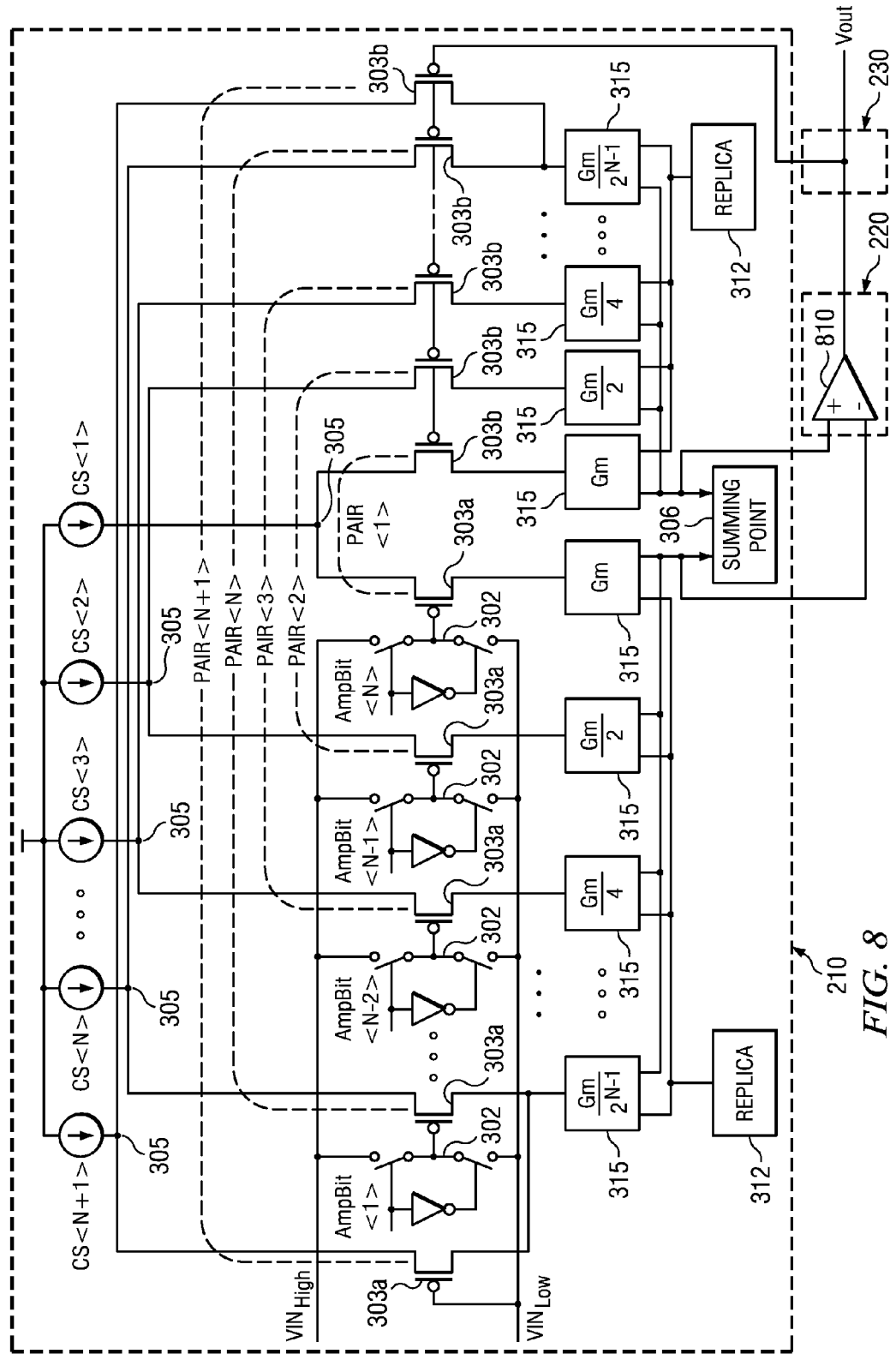
FIG. 8 is a circuit diagram illustrating an example embodiment of the internal circuitry of the voltage interpolation amplifier of FIG. 1.

Reference is now made to FIG. 8, which illustrates the circuitry of the voltage interpolation amplifier 200. As discussed above, the summing point 306 receives the first current from the resistor attenuation network(s) connected to the first transistors 303a, and the second current from the resistor attenuation network(s) connected to the second transistors 303b. The first and second currents are then provided as input to the gain-boosting stage 230, shown in FIG. 8 as operational amplifier 810. It should be understood that the operational amplifier 810 is simply one method for increasing gain, and that it is not necessary to include a specific amplifier 810 as long as the pre-amplification stage 210 is connected to circuitry that provides sufficient gain.

To ensure proper operation of the voltage interpolation amplifier 200, the first current should be substantially equal to the second current entering the summing point 306 (i.e., $I_F=I_S$). The operational amplifier 810 senses the voltages at the inputs of the summing point 306, and adjusts $V_{OUT}$ so that these two voltages are made equal. The resulting voltage $V_{OUT}$ is the interpolated voltage value located at the output stage 230. As discussed above, the output stage 230 is also used to provide low impedance output as the negative feedback input of the pre-amplification stage 210.

As previously discussed, the first current is determined by the input data bits AmpBit<1:N> in combination with the voltages received at $VIN_{HIGH}$ and $VIN_{LOW}$, while the second current is determined by the output voltage $V_{OUT}$. Therefore, in order to even the first and second currents at the gain-boosting stage 220, the operational amplifier 810 modulates the output voltage $V_{OUT}$ to drive the second transistors 303b, and thus, the second current to match the first current. This is illustrated in the equations below:

$$I_F=I_S \rightarrow \Sigma V_{G(K)}*Gm/(2^{K-1})+V_{G(N+1)}*Gm/(2^{N-1})=V_{OUT}*2Gm$$

$$2V_{OUT}=\Sigma V_{G(K)}/(2^{K-1})+V_{G(N-1)}/(2^{N-1}), \text{ from } K=1 \text{ to } K=N.$$

The modulated output voltage $V_{OUT}$ is the interpolated voltage of the input voltages located at $VIN_{HIGH}$ and $VIN_{LOW}$ in accordance with the input data bits AmpBit<1:N>. Accordingly, this interpolated voltage is provided at the output stage 230 as the output of the voltage interpolation amplifier 200.

What is claimed is:

1. An apparatus comprising:
    a plurality of input differential pairs, each pair comprising first and second transistors and having an initial transconductance, said first and second transistors of each input differential pair coupled at a source node;
    switches coupled to gates of a first portion of said first transistors, said switches operable, in response to digital input data, to couple said gates to a high input voltage node or to a low input voltage node;
    a first attenuation network coupled to the first transistor in each of a first portion of said input differential pairs, said first attenuation network operable to attenuate the initial transconductance of said first transistors in said first portion of input differential pairs to produce a binary-weighted effective transconductance; and
    a second attenuation network coupled to the second transistor in each of said first portion of input differential pairs, said second attenuation network operable to attenuate the initial transconductance of said second transistors in said first portion of input differential pairs to produce a binary-weighted effective transconductance;
    wherein a number of input differential pairs in said plurality of input differential pairs is one more than a number of bits of digital input data received by said apparatus.

2. The apparatus as set forth in claim 1, said apparatus further comprising:
    a current source coupled to each source node;
    a summing circuit coupled to said first attenuation network at a first summing node and coupled to said second attenuation network at a second summing node, said summing circuit operable to combine the effective transconductances at each of said first and second summing nodes and produce a binary-weighted total effective transconductance for said first transistors in said first portion of input differential pairs at said first summing node, and produce a binary-weighted total effective transconductance for said second transistors in said first portion of input differential pairs at said second summing node; and
    a replica circuit coupled to said first and second attenuation networks, said replica circuit operable to receive a portion of current from said first and second attenuation networks.

3. The apparatus as set forth in claim 2, wherein:
    said summing circuit is directly coupled to the first transistors in a second portion of said input differential pairs at said first summing node, and is directly coupled to the second transistors in said second portion of said input differential pairs at said second summing node;
    said summing circuit operable to combine the effective transconductances from the first attenuation networks and the initial transconductances from said first transistors in said second portion of input differential pairs at said first summing node to produce a binary-weighted total effective transconductance for said first transistors in said first and second portions of input differential pairs; and
    said summing circuit operable to combine the effective transconductances from the second attenuation networks and the initial transconductances from said second transistors in said second portion of input differential pairs at said second summing node to produce a binary-weighted total effective transconductance for said second transistors in said first and second portions on input differential pairs.

4. The apparatus as set forth in claim 2, wherein said first and second attenuation networks each comprise a plurality of resistor strings.

5. The apparatus as set forth in claim 4, wherein each of said plurality of resistor strings comprising said first attenuation network are coupled to said summing circuit, said replica circuit, and one of said first transistors in said first portion of input differential pairs.

6. The apparatus as set forth in claim 4, wherein each of said plurality of resistor strings comprising said second attenuation network are coupled to said summing circuit, said replica circuit, and one of said second transistors in said first portion of input differential pairs.

7. The apparatus as set forth in claim 2, wherein said first and second attenuation networks each comprise a string of resistors connected in series, the first and second transistors coupled to different taps in the strings.

8. The apparatus as set forth in claim 7, wherein said string of resistors comprising said first attenuation network is coupled to said summing circuit, said replica circuit, and each of said first transistors in said first portion of input differential pairs.

9. The apparatus as set forth in claim 7, wherein said string of resistors comprising said second attenuation network is coupled to said summing circuit, said replica circuit, and each of said second transistors in said first portion of input differential pairs.

10. The apparatus as set forth in claim 2, said apparatus further comprising:
a differential amplifier circuit coupled to the first and second summing nodes, said differential amplifier circuit operable to receive current from the transconductances received at said first and second summing nodes and produce an output voltage.

11. The apparatus as set forth in claim 10, wherein said output voltage is coupled to gates of the second transistors in all input differential pairs.

12. The apparatus as set forth in claim 11, wherein said differential amplifier circuit is operable to adjust said output voltage to effect a change in the current of the transconductances received at said second summing node, such that the current of the transconductances received at said second summing node is substantially equal to the current of the transconductances received at said first summing node.

13. The apparatus as set forth in claim 2, said apparatus further comprising:
a resistor string DAC coupled to said high input voltage node and to said low input voltage node, said resistor string DAC operable to generate a high input voltage on said high input voltage node and generate a low input voltage on said low input voltage node.

14. The apparatus as set forth in claim 1, wherein there are K input differential pairs, the initial transconductance of each input differential pair is Gm, and the binary-weighted effective transconductance is a function of $Gm/(2^{K-1})$.

15. The apparatus as set forth in claim 1, wherein gates of a second portion of said first transistors are directly coupled to said low input voltage node.

16. An apparatus comprising:
first and second input differential pairs, each pair comprising first and second transistors having an initial transconductance, said first and second transistors of each input differential pair coupled at a source node;
a switch coupled to a gate of the first transistor of said first input differential pair, said switch operable, in response to digital input data, to couple said gate to a high input voltage node or to a low input voltage node;
attenuation networks coupled to the first and second transistors in each of said first and second input differential pairs, said attenuation networks operable to attenuate the initial transconductances of said first and second transistors to produce binary-weighted effective transconductances; and
a summing circuit coupled to said attenuation networks, said summing circuit operable to receive the effective transconductances of said first and second transistors of said first and second input differential pairs;
wherein the gate of the first transistor of said second input differential pair is coupled directly to said low input voltage node, and the effective transconductances of the first and second transistors of said second input differential pair is equal to the effective transconductances of the first and second transistors of said first input differential pair.

17. The apparatus as set forth in claim 16, wherein:
said summing circuit is coupled to the attenuation networks coupled to the first transistors in each of said first and second input differential pairs at a first summing node, and is coupled to the attenuation networks coupled to the second transistors in each of said first and second input differential pairs at a second summing node, said summing circuit further operable to combine the effective transconductances at each of said first and second summing nodes and produce a binary-weighted total effective transconductance for said first transistors in each of said first and second input differential pairs at said first summing node, and produce a binary-weighted total effective transconductance for said second transistors in each of said first and second input differential pairs at said second summing node.

18. The apparatus as set forth in claim 17, wherein said attenuation networks each comprise a resistor string.

19. The apparatus as set forth in claim 18, wherein each resistor string is coupled to said summing circuit, a replica circuit, and one of said first or second transistors in said first and second input differential pairs;
wherein said replica circuit is operable to receive a portion of current from each attenuation network.

20. The apparatus as set forth in claim 17, wherein:
an attenuation network coupled to the first transistors in each of said first and second input differential pairs comprises a string of resistors connected in series, the first transistors coupled to different taps in the string; and
an attenuation network coupled to the second transistors in each of said first and second input differential pairs comprises a string of resistors connected in series, the second transistors coupled to different taps in the string.

21. The apparatus as set forth in claim 20, wherein said string of resistors comprising the attenuation network coupled to the first transistors is further coupled to said summing circuit and a replica circuit, said replica circuit operable to receive a portion of current from the attenuation network coupled to the first transistors.

22. The apparatus as set forth in claim 20, wherein said string of resistors comprising the attenuation network coupled to the second transistors is further coupled to said summing circuit and a replica circuit, said replica circuit operable to receive a portion of current from the attenuation network coupled to the second transistors.

23. The apparatus as set forth in claim 17, said apparatus further comprising:
a differential amplifier circuit coupled to the first and second summing nodes, said differential amplifier circuit operable to receive current from the transconductances received at said first and second summing nodes and produce an output voltage.

24. The apparatus as set forth in claim 23, wherein said output voltage is coupled to gates of the second transistors in the first and second input differential pairs.

25. The apparatus as set forth in claim 23, wherein said differential amplifier circuit is operable to adjust said output voltage to effect a change in the current of the transconductances received at said second summing node, such that the current of the transconductances received at said second summing node is substantially equal to the current of the transconductances received at said first summing node.

26. The apparatus as set forth in claim 17, said apparatus further comprising:
a resistor string DAC coupled to said high input voltage node and to said low input voltage node, said resistor string DAC operable to generate a high input voltage on said high input voltage node and generate a low input voltage on said low input voltage node.

27. An apparatus comprising:
first and second input differential pairs, each pair comprising first and second transistors having an initial transconductance, said first and second transistors of each input differential pair coupled at a source node;
switches coupled to gates of the first transistors of said first and second input differential pairs, said switches operable, in response to digital input data, to couple said gates to a high input voltage node or to a low input voltage node;
attenuation networks coupled to the first and second transistors in each of said first and second input differential pairs, said attenuation networks operable to attenuate the initial transconductances of said first and second transistors to produce binary-weighted effective transconductances; and
a summing circuit coupled to said attenuation networks, said summing circuit operable to receive the effective transconductances of said first and second transistors of said first and second input differential pairs;
wherein the effective transconductance of the first input differential pair is equal to the initial transconductance of said first input differential pair, and the effective transconductance of the second input differential pair is equal to half the effective transconductance of the first input differential pair.

28. The apparatus as set forth in claim 27, wherein:
said summing circuit is coupled to the attenuation networks coupled to the first transistors in each of said first and second input differential pairs at a first summing node, and is coupled to the attenuation networks coupled to the second transistors in each of said first and second input differential pairs at a second summing node, said summing circuit further operable to combine the effective transconductances at each of said first and second summing nodes and produce a binary-weighted total effective transconductance for said first transistors in each of said first and second input differential pairs at said first summing node, and produce a binary-weighted total effective transconductance for said second transistors in each of said first and second input differential pairs at said second summing node.

29. The apparatus as set forth in claim 28, wherein said attenuation networks each comprise a resistor string.

30. The apparatus as set forth in claim 29, wherein each resistor string is coupled to said summing circuit, a replica circuit, and one of said first or second transistors in said first and second input differential pairs;
wherein said replica circuit is operable to receive a portion of current from each attenuation network.

31. The apparatus as set forth in claim 28, wherein:
an attenuation network coupled to the first transistors in each of said first and second input differential pairs comprises a string of resistors connected in series, the first transistors coupled to different taps in the string; and
an attenuation network coupled to the second transistors in each of said first and second input differential pairs comprises a string of resistors connected in series, the second transistors coupled to different taps in the string.

32. The apparatus as set forth in claim 31, wherein said string of resistors comprising the attenuation network coupled to the first transistors is further coupled to said summing circuit and a replica circuit, said replica circuit operable to receive a portion of current from the attenuation network coupled to the first transistors.

33. The apparatus as set forth in claim 31, wherein said string of resistors comprising the attenuation network coupled to the second transistors is further coupled to said summing circuit and a replica circuit, said replica circuit operable to receive a portion of current from the attenuation network coupled to the second transistors.

34. The apparatus as set forth in claim 28, said apparatus further comprising:
a differential amplifier circuit coupled to the first and second summing nodes, said differential amplifier circuit operable to receive current from the transconductances received at said first and second summing nodes and produce an output voltage.

35. The apparatus as set forth in claim 34, wherein said output voltage is coupled to gates of the second transistors in the first and second input differential pairs.

36. The apparatus as set forth in claim 34, wherein said differential amplifier circuit is operable to adjust said output voltage to effect a change in the current of the transconductances received at said second summing node, such that the current of the transconductances received at said second summing node is substantially equal to the current of the transconductances received at said first summing node.

37. The apparatus as set forth in claim 28, said apparatus further comprising:
a resistor string DAC coupled to said high input voltage node and to said low input voltage node, said resistor string DAC operable to generate a high input voltage on said high input voltage node and generate a low input voltage on said low input voltage node.

38. An apparatus comprising:
a plurality of input differential pairs, each pair comprising first and second transistors having an initial transconductance, said first and second transistors of each input differential pair coupled at a source node;
switches coupled to gates of the first transistors in a first portion of said input differential pairs, said switches operable, in response to digital input data, to couple said gates to a high input voltage node or to a low input voltage node;
attenuation networks coupled to the first and second transistors in each of said input differential pairs, said attenuation networks operable to attenuate the initial transconductances of said first and second transistors to produce binary-weighted effective transconductances; and
a summing circuit coupled to said attenuation networks, said summing circuit operable to receive the effective transconductances of said first and second transistors of said first and second input differential pairs;

wherein a gate of the first transistor in a last input differential pair is directly coupled to said low input voltage node, and the effective transconductance of said last input differential pair is equal to the effective transconductance of a previous input differential pair; and wherein the effective transconductance of a first input differential pair is equal to the initial transconductance of said first input differential pair.

39. The apparatus as set forth in claim 38, wherein a number of input differential pairs in said plurality of input differential pairs is one more than a number of bits of digital input data received by said apparatus.

40. The apparatus as set forth in claim 38, wherein:

said summing circuit is coupled to the attenuation networks coupled to the first transistors in each of said plurality of input differential pairs at a first summing node, and is coupled to the attenuation networks coupled to the second transistors in each of said plurality of input differential pairs at a second summing node, said summing circuit further operable to combine the effective transconductances at each of said first and second summing nodes and produce a binary-weighted total effective transconductance for said first transistors in said plurality of input differential pairs at said first summing node, and produce a binary-weighted total effective transconductance for said second transistors in said plurality of input differential pairs at said second summing node.

41. The apparatus as set forth in claim 40, wherein said attenuation networks each comprise a resistor string.

42. The apparatus as set forth in claim 41, wherein each resistor string is coupled to said summing circuit, a replica circuit, and one of said first or second transistors in said plurality of input differential pairs;

wherein said replica circuit is operable to receive a portion of current from each attenuation network.

43. The apparatus as set forth in claim 40, wherein:

an attenuation network coupled to the first transistors in each of said plurality of input differential pairs comprises a string of resistors connected in series, the first transistors coupled to different taps in the string; and an attenuation network coupled to the second transistors in each of said plurality of input differential pairs comprises a string of resistors connected in series, the second transistors coupled to different taps in the string.

44. The apparatus as set forth in claim 43, wherein said string of resistors comprising the attenuation network coupled to the first transistors is further coupled to said summing circuit and a replica circuit, said replica circuit operable to receive a portion of current from the attenuation network coupled to the first transistors.

45. The apparatus as set forth in claim 43, wherein said string of resistors comprising the attenuation network coupled to the second transistors is further coupled to said summing circuit and a replica circuit, said replica circuit operable to receive a portion of current from the attenuation network coupled to the second transistors.

46. The apparatus as set forth in claim 40, said apparatus further comprising:

a differential amplifier circuit coupled to the first and second summing nodes, said differential amplifier circuit operable to receive current from the transconductances received at said first and second summing nodes and produce an output voltage.

47. The apparatus as set forth in claim 46, wherein said output voltage is coupled to gates of the second transistors in said plurality of input differential pairs.

48. The apparatus as set forth in claim 47, wherein said differential amplifier circuit is operable to adjust said output voltage to effect a change in the current of the transconductances received at said second summing node, such that the current of the transconductances received at said second summing node is substantially equal to the current of the transconductances received at said first summing node.

49. The apparatus as set forth in claim 40, said apparatus further comprising:

a resistor string DAC coupled to said high input voltage node and to said low input voltage node, said resistor string DAC operable to generate a high input voltage on said high input voltage node and generate a low input voltage on said low input voltage node.

50. The apparatus as set forth in claim 38, wherein there are K input differential pairs, the initial transconductance of each input differential pair is Gm, and the binary-weighted effective transconductance is a function of $Gm/(2^{K-1})$.

51. A method for producing an interpolated voltage, the method comprising:

receiving a high input voltage, a low input voltage, and digital input data;

selectively coupling first transistors in a plurality of input differential pairs to said high and low input voltages in response to said digital input data;

receiving a feedback voltage at second transistors in said plurality of input differential pairs;

attenuating an initial transconductance of the first and second transistors in said plurality of input differential pairs to produce binary-weighted effective transconductances for the first and second transistors in said plurality of input differential pairs;

applying the binary-weighted effective transconductances of the first and second transistors as input to a differential amplifier;

producing an interpolated voltage based on the binary-weighted transconductances of the first and second transistors in said plurality of input differential pairs;

applying the interpolated voltage as the feedback voltage; and outputting the interpolated voltage;

wherein a number of input differential pairs in said plurality of input differential pairs is one more than a number of bits of digital input data received.

52. The method as set forth in claim 51, further comprising:

adjusting the binary-weighted effective transconductances of the first transistors by switching the voltages to which the first transistors are coupled; and adjusting the binary-weighted effective transconductances of the second transistors in response to a change in the binary-weighted effective transconductances of the first transistors.

* * * * *